(12) United States Patent
West

(10) Patent No.: US 7,276,894 B2
(45) Date of Patent: Oct. 2, 2007

(54) DYNAMIC CRADLE ASSEMBLY POSITIONER SYSTEM FOR POSITIONING AN ELECTRONIC DEVICE TEST HEAD

(75) Inventor: Christopher L. West, Tabernacle, NJ (US)

(73) Assignee: inTEST Corporation, Cherry Hill, NJ (US)

( * ) Notice: Subject to any disclaimer, the term of this patent is extended or adjusted under 35 U.S.C. 154(b) by 0 days.

(21) Appl. No.: 10/511,510

(22) PCT Filed: Apr. 11, 2003

(86) PCT No.: PCT/US03/11312

§ 371 (c)(1),
(2), (4) Date: May 26, 2005

(87) PCT Pub. No.: WO03/089834

PCT Pub. Date: Oct. 30, 2003

(65) Prior Publication Data

US 2006/0001416 A1    Jan. 5, 2006

(51) Int. Cl.
*G01R 31/00* (2006.01)

(52) U.S. Cl. .................................................. 324/158.1

(58) Field of Classification Search ........ 324/754–761, 324/158.1; 73/868.5, 865.8
See application file for complete search history.

(56) References Cited

U.S. PATENT DOCUMENTS

| 5,197,846 | A |   | 3/1993  | Uno et al. |
| 5,450,766 | A | * | 9/1995  | Holt ........................... 73/866.5 |
| 5,900,737 | A |   | 5/1999  | Graham et al. |
| 5,931,048 | A | * | 8/1999  | Slocum et al. ........... 74/490.07 |
| 5,976,156 | A |   | 11/1999 | Taylor et al. |

FOREIGN PATENT DOCUMENTS

WO    WO 00/41536    7/2000

OTHER PUBLICATIONS

International Search Report corresponding to application No. PCT/US03/11312 dated Dec. 9, 2003.

* cited by examiner

*Primary Examiner*—Vinh P. Nguyen
(74) *Attorney, Agent, or Firm*—RatnerPrestia

(57) ABSTRACT

A cradle motion unit for positioning a test head. The test head has a support structure which provides three degrees of freedom, a first lock, and a second lock. The three degrees of freedom are prevented by actuation of the first lock and second lock.

16 Claims, 16 Drawing Sheets

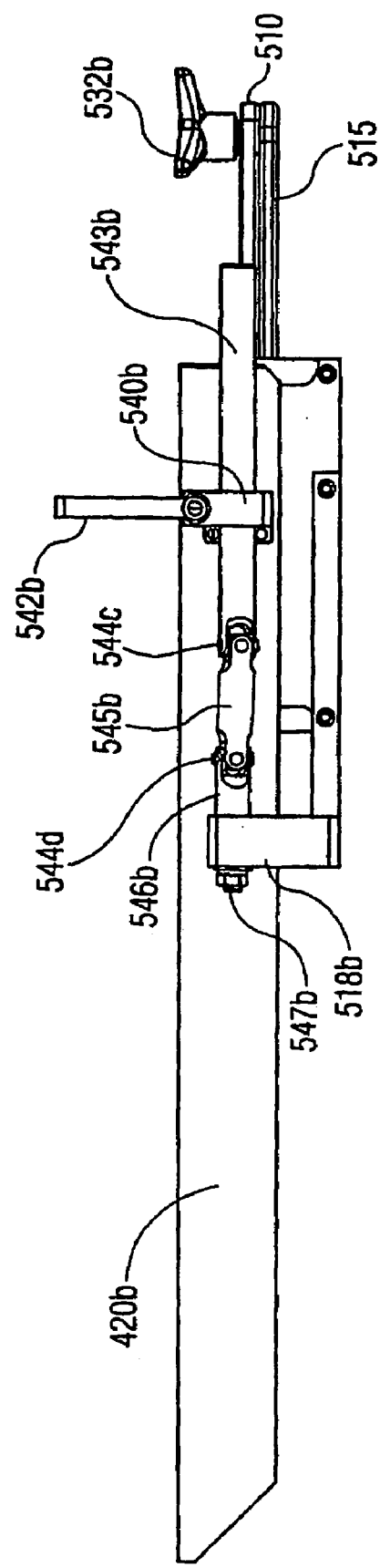

DYNAMIC CRADLE ASSEMBLY POSITIONER SYSTEM FOR POSITIONING AN ELECTRONIC DEVICE TEST HEAD

This Application is a U.S. National Phase Application of PCT International Application PCT/US03/011312.

FIELD OF THE INVENTION

This invention relates to the field of electronic test head positioners. More particularly, it relates to test head positioners that can manipulate a test head in a plurality of degrees of freedom.

BACKGROUND OF THE INVENTION

In the automatic testing of integrated circuits (IC) and other electronic devices, special machines, referred to hereinafter as "peripherals," have been used which place the device to be tested in position for testing by an automatic testing system. Peripherals include wafer probers, package handlers, and the like; the specific type of peripheral utilized is dependent upon the stage of production where it is used. The electronic testing itself is provided by a large and expensive automatic testing system which includes a test head which has been required to connect to and dock with the peripheral. In such testing systems, the test head has been usually very heavy—on the order of 40 to 1000 kilograms. The reason for this heaviness is that the test head uses precision high speed electronic timing signals as well as other data signals, which requires that the electronic circuit must be located as close as possible to the device under test. Accordingly, the test head has been densely packaged with electronic circuits in order to achieve the high speed testing of the sophisticated devices.

Test head positioner systems may be used to position the test head with respect to the peripheral. When the test head is accurately in position with respect to the peripheral, the test head and the peripheral are said to be aligned. When the test head and the peripheral are aligned, the fragile test head and peripheral electrical connectors can be brought together (i.e., docked), enabling the transfer of test signals between the test head and the peripheral. Prior to docking, the fragile test head and peripheral electrical connectors must be precisely aligned to avoid damaging the fragile electrical connectors.

In order to enable such precise alignment of fragile electrical connectors, electronic test head positioners typically facilitate maneuvering the test head through space with six degrees of freedom. As shown in FIG. 9, six degrees of motion are defined. The positioner system in accordance with an exemplary embodiment of the present invention accomplishes these six degrees of motion. FIG. 9 illustrates left-right motion or motion along the X axis; up-down motion or motion along the Y axis; in-out motion along the Z axis; motion about the Y-axis or theta motion; motion about the X-axis or pitch motion; and motion about the Z-axis or roll motion.

Further, test head positioners also typically provide a substantially weightless or compliant condition to the test head so that the test head may be manipulated by hand for each degree of freedom and so that accurate docking and undocking of the test head relative to the peripheral may be accomplished. An example of an electronic test head positioner is disclosed in a previous patent by Smith (U.S. Pat. No. 4,527,942), herein incorporated by reference. This patent discloses a positioner assembly which enables a test head to be in a substantially weightless condition and to move with six degrees of freedom.

In order to provide the six degrees of freedom, the test head may be attached to a cradle assembly, which may be a U-shaped holder for the test head. Cradle assemblies are shown in U.S. Pat. No. 4,527,942, the patent by Smith (U.S. Pat. No. 4,705,447), and the patent by Holt (U.S. Pat. No. 5,450,766). A cradle typically provides at least two of the required degrees of freedom. When a cradle is used to hold the test head, problems have been incurred in easily and quickly locking the cradle into place after it has been docked with the peripheral.

SUMMARY OF THE INVENTION

A cradle motion unit for positioning a test head comprising a support structure which provides three degrees of freedom, a first lock, and a second lock. The three degrees of freedom are prevented by actuation of the first lock and the second lock.

BRIEF DESCRIPTION OF THE DRAWINGS

FIG. 8A is a top view of a cradle side, attached cradle motion unit, and associated components.

DETAILED DESCRIPTION OF THE INVENTION

Figure 1A:
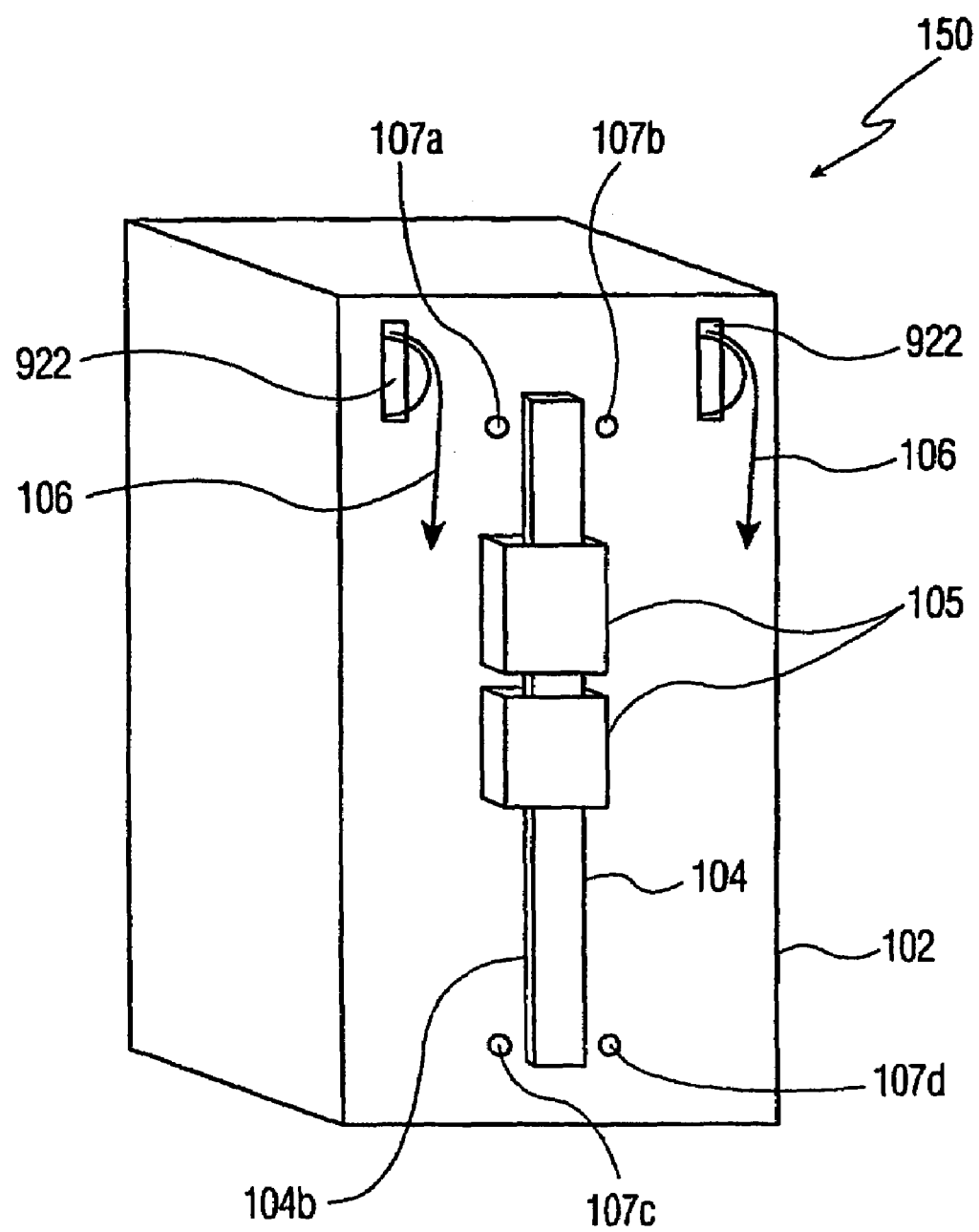
FIG. 1A is a perspective view of a portion of a test head positioner system in accordance with the present invention.
Figure 1B:
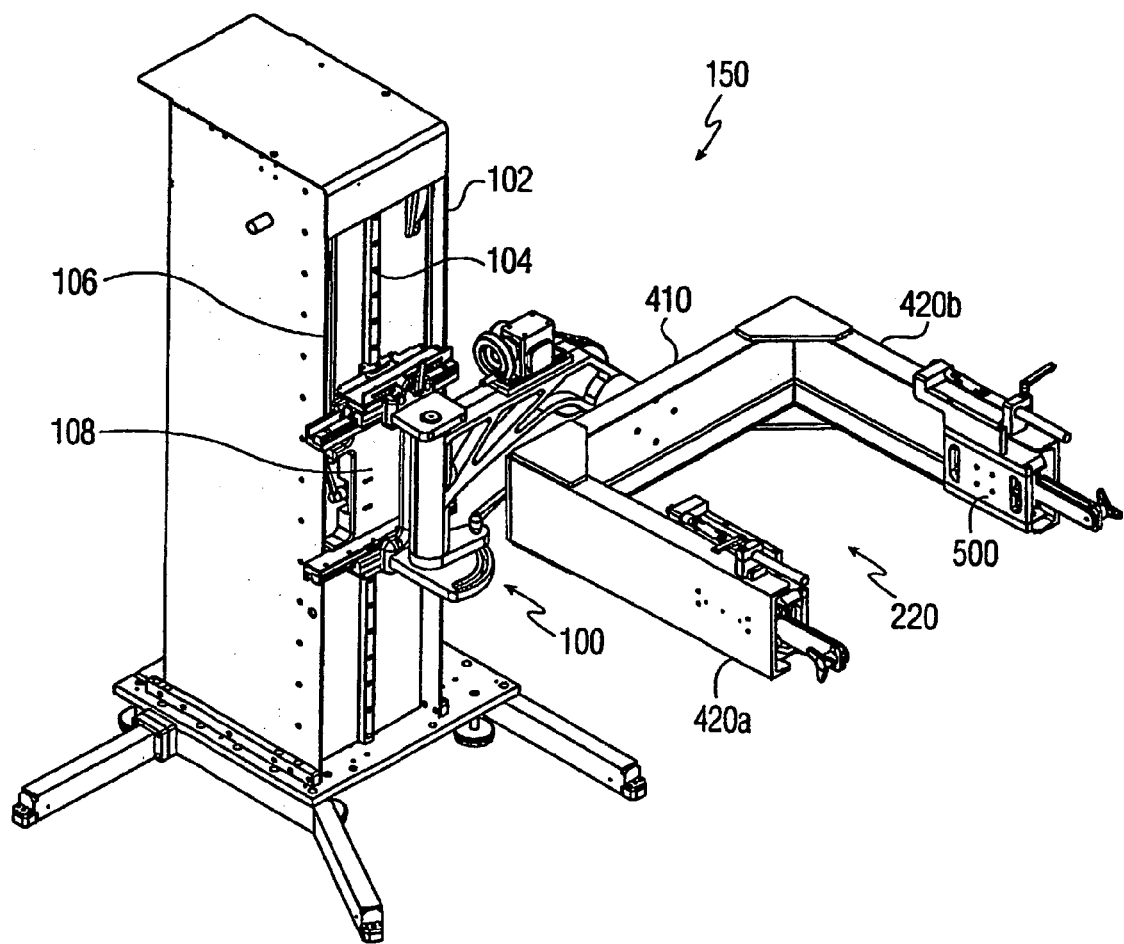
FIG. 1B is a perspective view of the test head system showing features in accordance with the present invention.

The details of positioner system 150 are shown in FIGS. 1A and 1B in which there is provided a support column 102. The details of support column 102 are shown, for example, in published patent application WO 00/41536 published Jul. 20, 2000 and application no. PCT/US/00/00704 filed Jan. 12, 2000 which is hereby incorporated by reference.

Figure 2A:
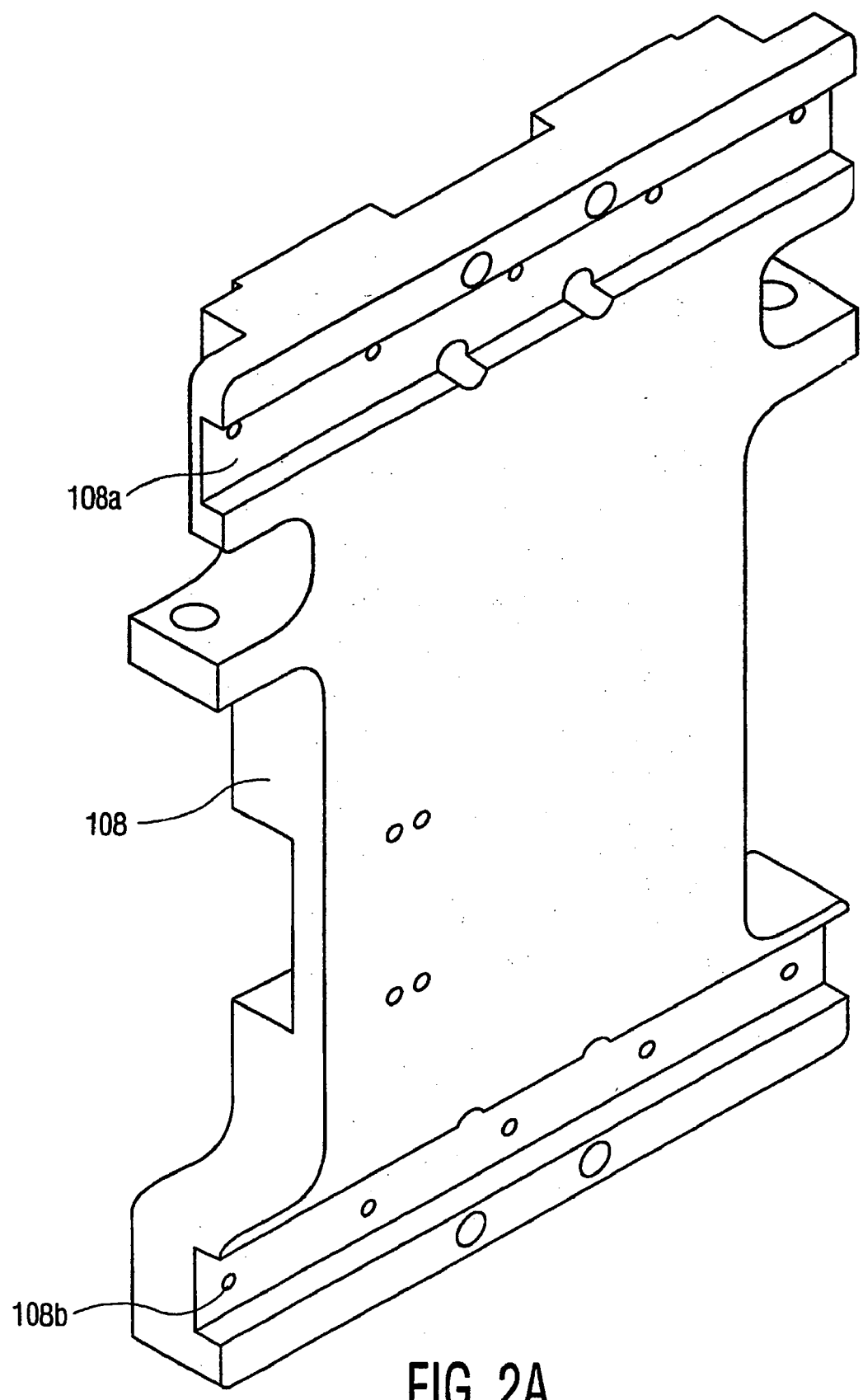
FIG. 2A is a perspective view of a vertical motion plate of the test head positioner system of FIG. 1B.

As shown, on a front surface of support column 102, vertical rail 104 is attached to the front surface of support column 102. Vertical rail 104 extends, for example, along the length of support column 102. Referring to FIGS. 1B and 2C, and as further described below, arm unit 100 is coupled to a vertical support, or main arm, structure 108, sometimes referred to as vertical motion plate 108, so that arm unit 100 may move upward and downward along vertical rail 104. Referring to FIG. 1A, appropriate bumpers 107A-D may be situated at the upper limit and lower limit of vertical rail 104 to limit the range of travel of vertical motion plate 108 as it is moved upward and downward along vertical rail 104.

Vertical motion ball slides 105 engage and slide along vertical rail 104. Referring to FIGS. 2A and 2C, vertical motion plate 108 is attached to vertical ball slides 105. Thus, as vertical ball slides 105 slide upward and downward along vertical rail 104, vertical motion plate 108 also moves upward and downward along with vertical ball slides 105.

A plurality of cables 106 are attached to vertical motion plate 108. The means for attaching cables 106 to vertical motion plate 108 is not shown, but the attachment can be accomplished in a manner that is known to those skilled in the art. These cables are received into pulley assemblies 922. The cables extend over pulley assemblies 922 and back down into a counter weight system (not shown) which is situated in support column 102. An example of a counter weight system is shown in U.S. Pat. No. 4,527,942 and in U.S. Pat. No. 5,450,766

As previously stated, vertical motion plate 108 is attached to cables 106. Thus, vertical motion plate 108 is able to move upward and downward in a substantially-weightless condition by virtue of its attachment to the counter balance system via cables 106.

Figure 2B:
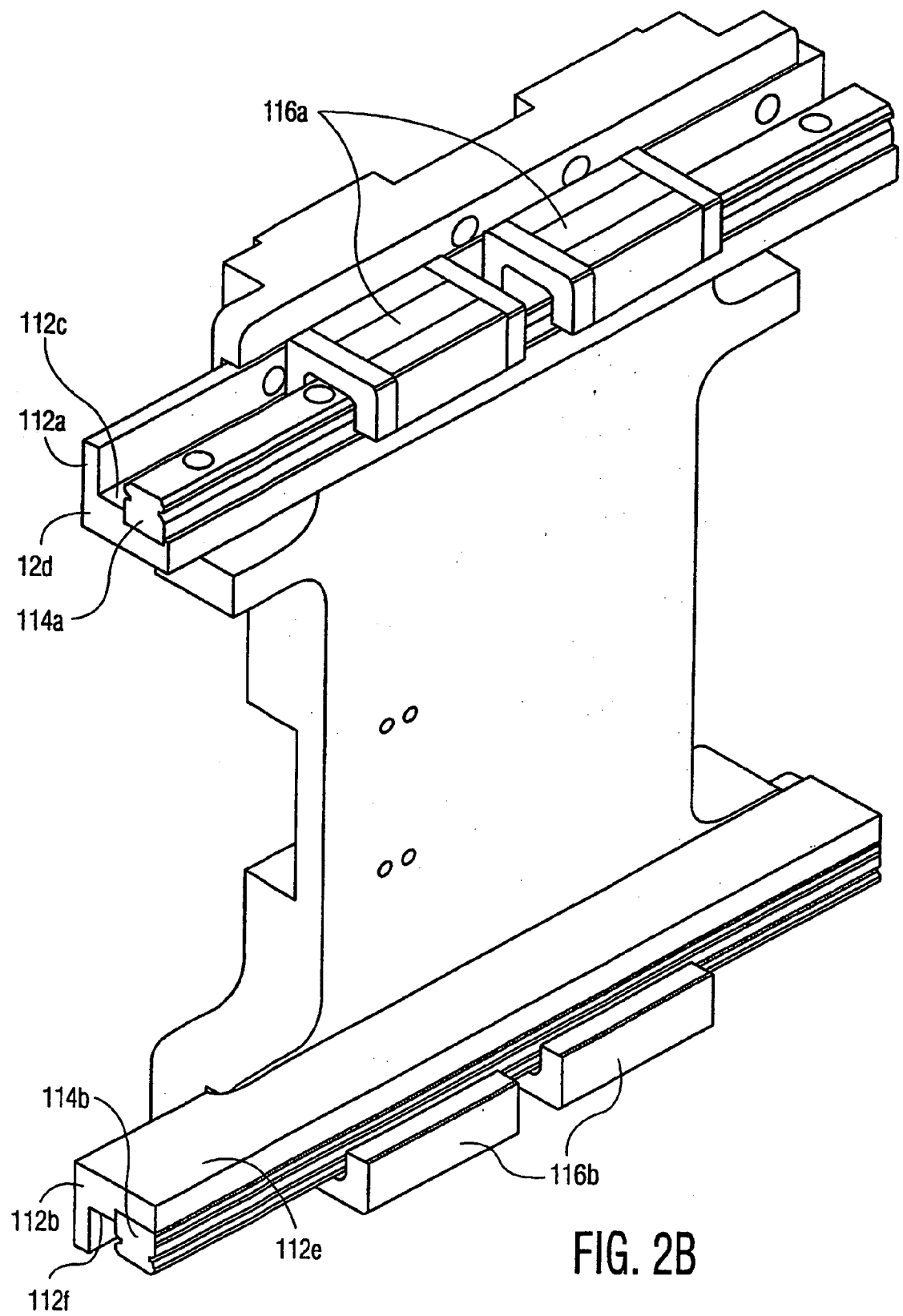
FIG. 2B is a perspective view of the vertical motion plate with rails and ball slides.
Figure 2C:
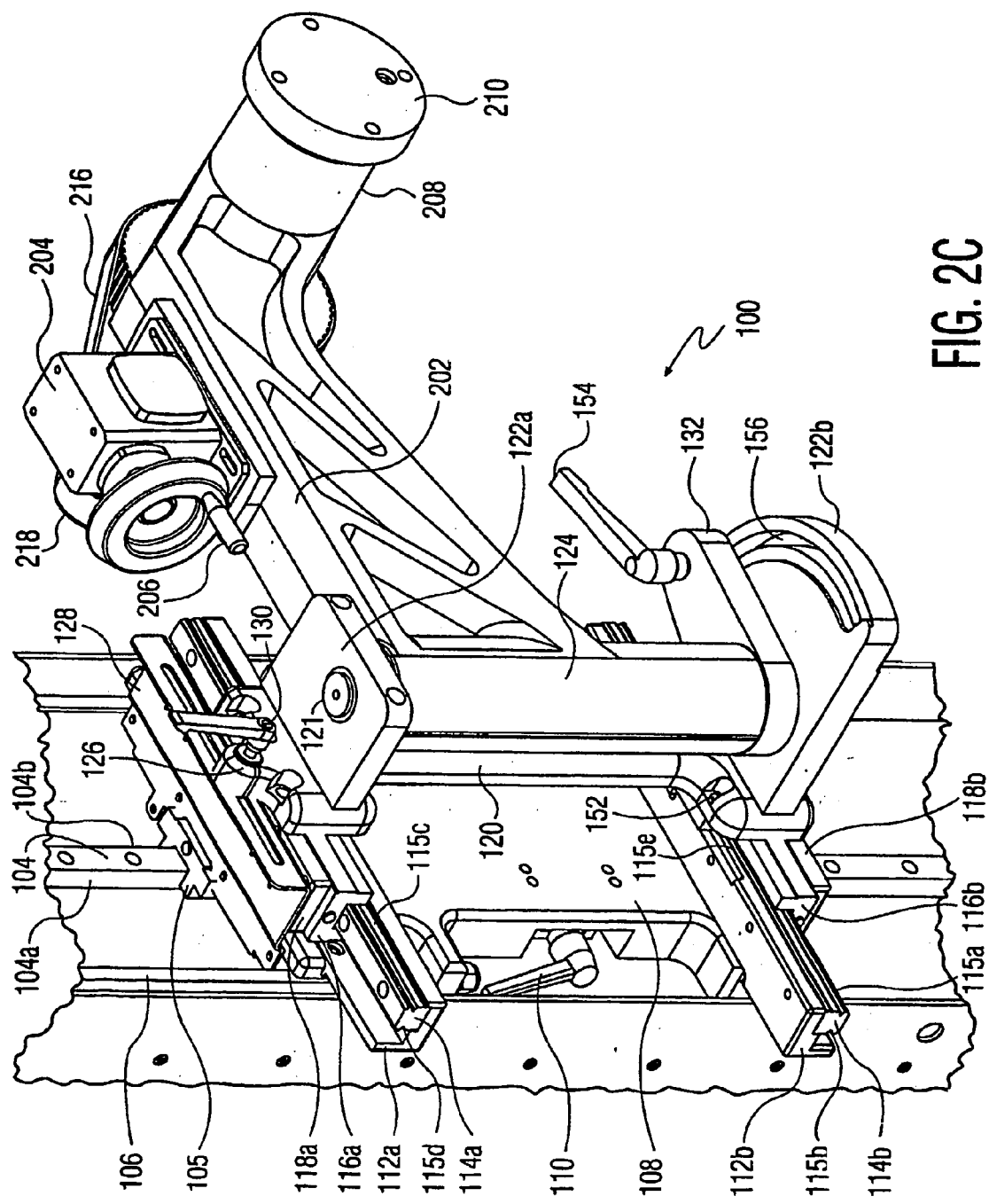
FIG. 2C is a perspective view of the vertical motion plate coupled members which allow the test head to be moved in various directions.

Referring to FIGS. 2A-2C, vertical motion plate 108 will now be described in more detail. Vertical motion plate 108 includes vertical motion lock mechanism 110, which may be a lock mechanism as described in published patent application WO 00/41536 published Jul. 20, 2000 and application no. PCT/US/00/00704 filed Jan. 12, 2000.

To provide low-friction horizontal side-to-side motion, vertical motion plate 108 includes upper and lower slots 108a,b. Rail holders 112a,b are situated within slots 108a,b respectively. Rail holders 112a,b are L-shaped members which, while attached to the vertical face of vertical motion plate 108 via vertical motion plate slots 108a,b, provide respective horizontal surfaces. Thus, rail holder 112a provides two horizontal surfaces 112c, 112d, surface 112c facing upwards and surface 112d facing downwards. Similarly, rail holder 112b also provides two horizontal surfaces 112e, 112f, surface 112e facing upwards and surface 112f facing downwards. In the embodiment shown, horizontal rail 114a is situated on the upward facing horizontal face 112c of rail holder 112a and faces upwards. Horizontal rail 114b is attached to the downward facing horizontal surface 112f of rail holder 112b. Thus, rail 114b projects downwards. Rails 114a and 114b are substantially parallel to each other and are coupled to vertical motion plate 108 via rail holders 112a and 112b.

Ball slides 116a are a pair of bearings that are engaged with and slide along rail 114a. Thus, ball slides 116a are situated above rail 114a. Furthermore, ball slides 116b are another pair of bearings that are engaged with rail 114b. In other words, ball slides 116b are situated below rail 114b. Thus, ball slides 116b slide along rail 114b.

Ball slides 105 and 116a, b and rails 104, and 114a,b are manufactured, for example, by NSK Corporation.

Ball slide attachment plates 118a,b are also included. Ball slide attachment plate 118a is attached to and situated above ball slides 116a. Ball slide attachment plate 118b is situated below and is attached to ball slides 116b.

Elbow mount plate 120 is included. In an exemplary embodiment of the present invention, elbow mount plate 120 is a single plate that extends from ball slide attachment plate 118a to ball slide attachment plate 118b. In an alternative embodiment of the present invention, elbow mount plate 120 may be replaced with two separate elbow mount plate sections which are attached to ball slide attachment plate 118a,b respectively. In yet another embodiment, attachment plates 118a,b and elbow mount plate 120 may all be incorporated in a single casting.

Thus, elbow mount plate 120 slides horizontally from side to side along with ball slides 116a,b. As will be described elbow mount plate 120 supports the test head load. Thus, the four ball slides 116a,b provide horizontal motion of the load and bear the weight and torque of the load as well. The friction opposing horizontal side-to-side motion is determined by the friction associated with ball slides 116a,b, which in turn is determined by their respective loadings and orientations. The inventor has discovered that by having the two rails 114a,b mounted on horizontal surfaces so that they project in a vertical direction the friction is substantially reduced in comparison to that which is experienced when the rails are mounted so that they project horizontally. In an alternative embodiment rail 114a may be mounted on the downwards facing horizontal surface 112d of rail holder 112a so that it projects downwards, and rail 114b may be mounted on the upwards facing horizontal surface 112e of rail holder 114b so that it projects upwards. For further embodiments, it is clearly possible to mount rails 112a,b such that they both project upwards or downwards.

Elbow mount plate 120 includes lock projection 126.

Lock bar 128 is preferably attached to a top surface of ball slide attachment plate 118a. Lock bar 128 provides a slot which coincides with an opening formed in lock projection 126. Thus, lock 130 extends through the opening in lock projection 126 and then through the slot in lock bar 128. When lock 130 is actuated, friction is applied to an inner surface of lock bar 128 thus preventing movement of elbow mount plate 120 relative to lock bar 128.

Stopper 152 is optionally situated behind elbow mount plate 120. A slot 115E is formed along an edge of rail holder 112b. Thus, as elbow mount plate 120 slides from side to side, stopper 152 slides within the slot which is formed in rail holder 112b. This provides an additional control of travel of elbow mount plate 120 relative to vertical motion plate 108.

Upper bearing block 122a extends from and is attached to an upper portion of elbow mount plate 120. Lower bearing block 122b extends from and is attached to a lower portion of elbow mount plate 120. Upper bearing block 122a and lower bearing block 122b include coinciding openings. FIG. 2C shows the location of the opening 121 in upper bearing block 122a. The coinciding opening in lower bearing block 122b is not shown. Cylinder 124 is situated between upper elbow plate 122a and lower bearing block 122b. Cylinder 124 pivots within the coinciding openings which are included in upper bearing block 122a and lower bearing block 122b.

At the lower end of cylinder 124, cylinder projection 132 is located. Cylinder projection 132 includes an opening to accommodate lock 154. Lower bearing block 122b includes a circular-arc-shaped slot 156 that accommodates lock 154. Thus, lock 154 extends through cylinder projection 132 and lock slot 156. By actuating lock 154, friction is provided along a bottom surface of lower bearing block 122b through lock slot 156 in order to prevent rotational motion of cylinder 124.

Lower bearing block 122b may also include an optional bumper slot (not shown). An optional bumper may be affixed to a bottom surface of cylinder projection 132. Thus, as cylinder projection 132 rotates, the optional bumper may travel along the optional bumper slot thereby allowing the optional bumper and bumper slot to control the range of motion of cylinder 124 as it rotates.

Cylinder 124 is attached to or included with forearm 202.

Figure 3:
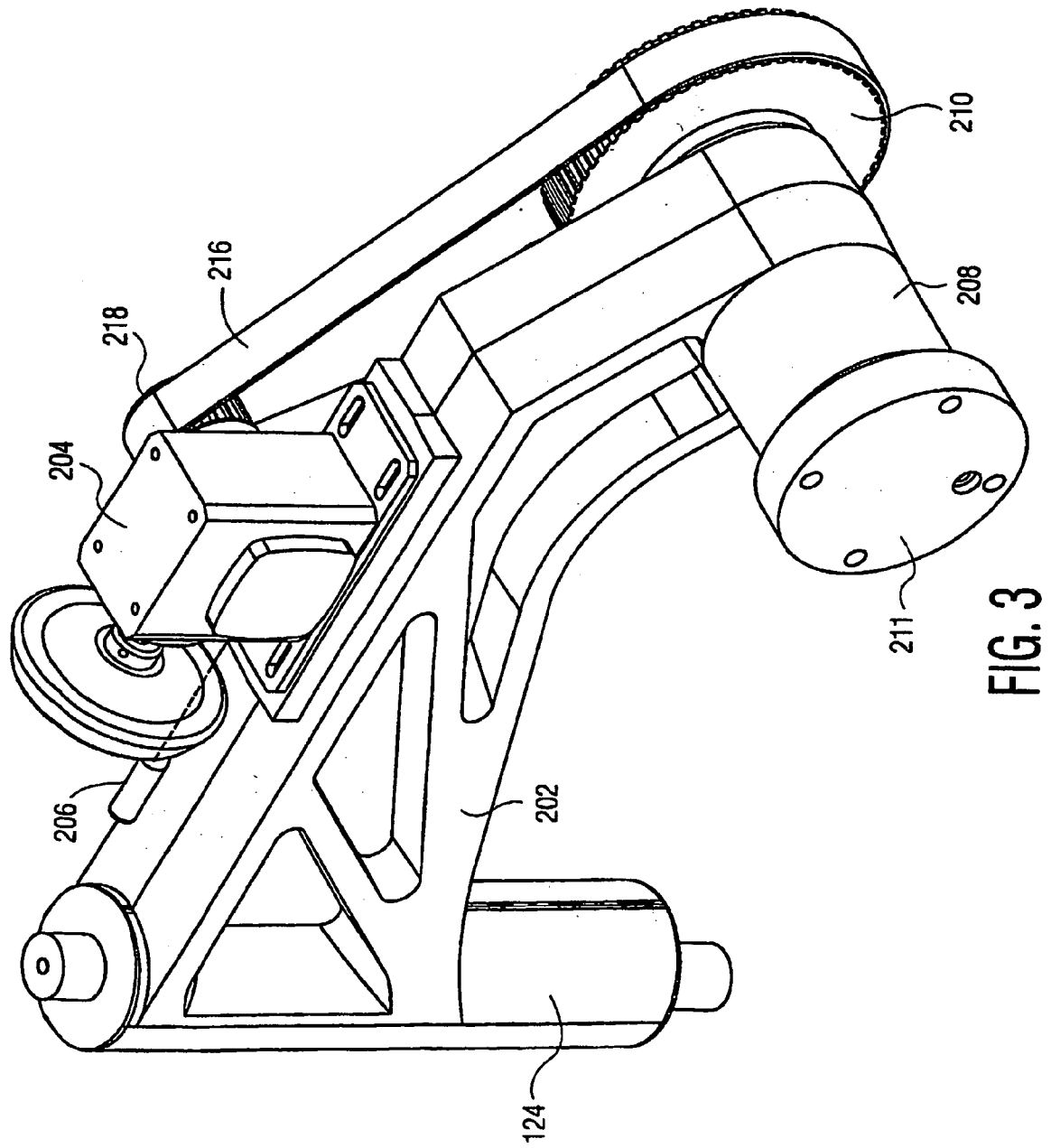
FIG. 3 is a perspective view of a crank and cylinder subsystem of the test head positioner system of FIGS. 1A and 1B.

Forearm 202 is better shown in FIGS. 2C and 3. On top of forearm 202 is mounted gearbox 204. The gears in gearbox 204 are turned via crank 206 by means of a coupling shaft. As crank 206 is rotated, the gears within gearbox 204 turn to cause rotation of a gearbox shaft (not visible) which extends out of gearbox 204. The gearbox shaft is orthogonal to the coupling shaft which is directly turned by the rotation of crank 206. Pulley 218 is attached to the gearbox shaft. Thus, rotation of crank 206 causes pulley 218 to rotate. Belt 216 engages pulley 218 and moves as pulley 218 rotates. Belt 216 also engages pulley 210. Pulley 210 is attached to a drive shaft (not visible) within forearm cylinder 208 and which extends from the front of forearm cylinder 208 to the rear of forearm cylinder 208. Cradle mounting flange 211 is attached to the drive shaft at the front of forearm cylinder 208, and pulley 210 is attached to the drive shaft at the rear of forearm cylinder 208. Thus, as crank 206 is turned, pulley 218 rotates. The rotation of pulley 218 causes movement of belt 216. The movement of belt 216 causes pulley 210, the non-visible drive shaft, and cradle mounting flange 211 to rotate.

Figure 4A:
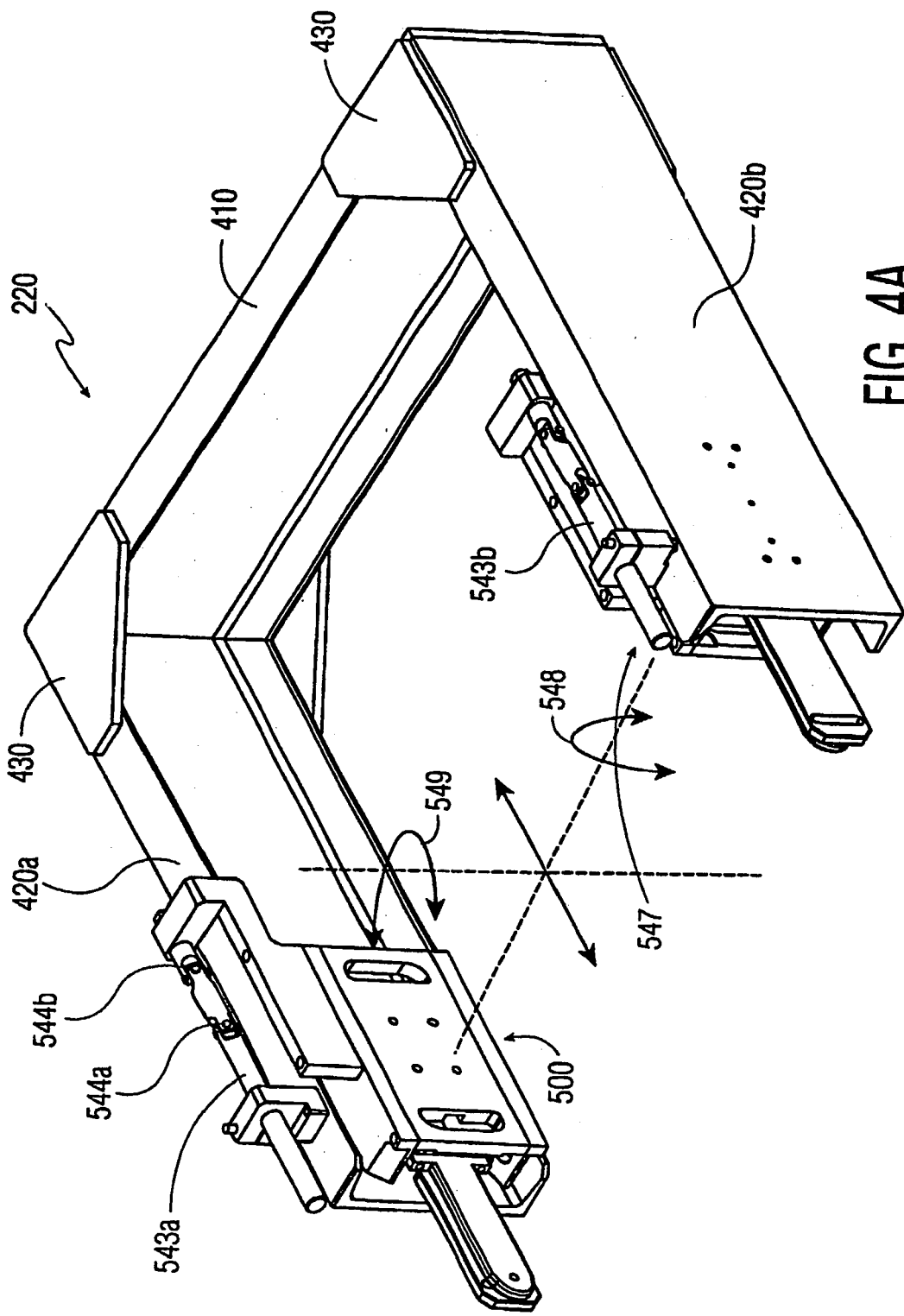
FIG. 4A is a perspective view of a test head cradle assembly in accordance with the present invention, shown in a neutral position.

Cradle 220, shown, for example, in FIGS. 1B and 4A, is attached to cradle mounting flange 211. Thus, as cradle mounting flange 211 rotates, cradle 220 also rotates. Bracket 212 is attached to the rear of pulley 210. Cable trowel 214 is attached to bracket 212. Thus, cables, which connect the test head to a test system cabinet (not shown), extend from the test head and through the cable trowel before reaching test system cabinet (not shown). Thus, by turning crank 206, the cables are able to move within cable trowel 214 and along with the rotation of cradle 220.

When a test head load is attached to cradle 220, it is coupled to the vertical motion plate 108 through a number of horizontal support structures, including ball slide attachment plates 118a, 118b, and forearm 202. The ball slides 116a, 116b also couple horizontal support structures to the rails so that the horizontal support structures may be positioned horizontally relative to the vertical motion plate.

Figure 4B:
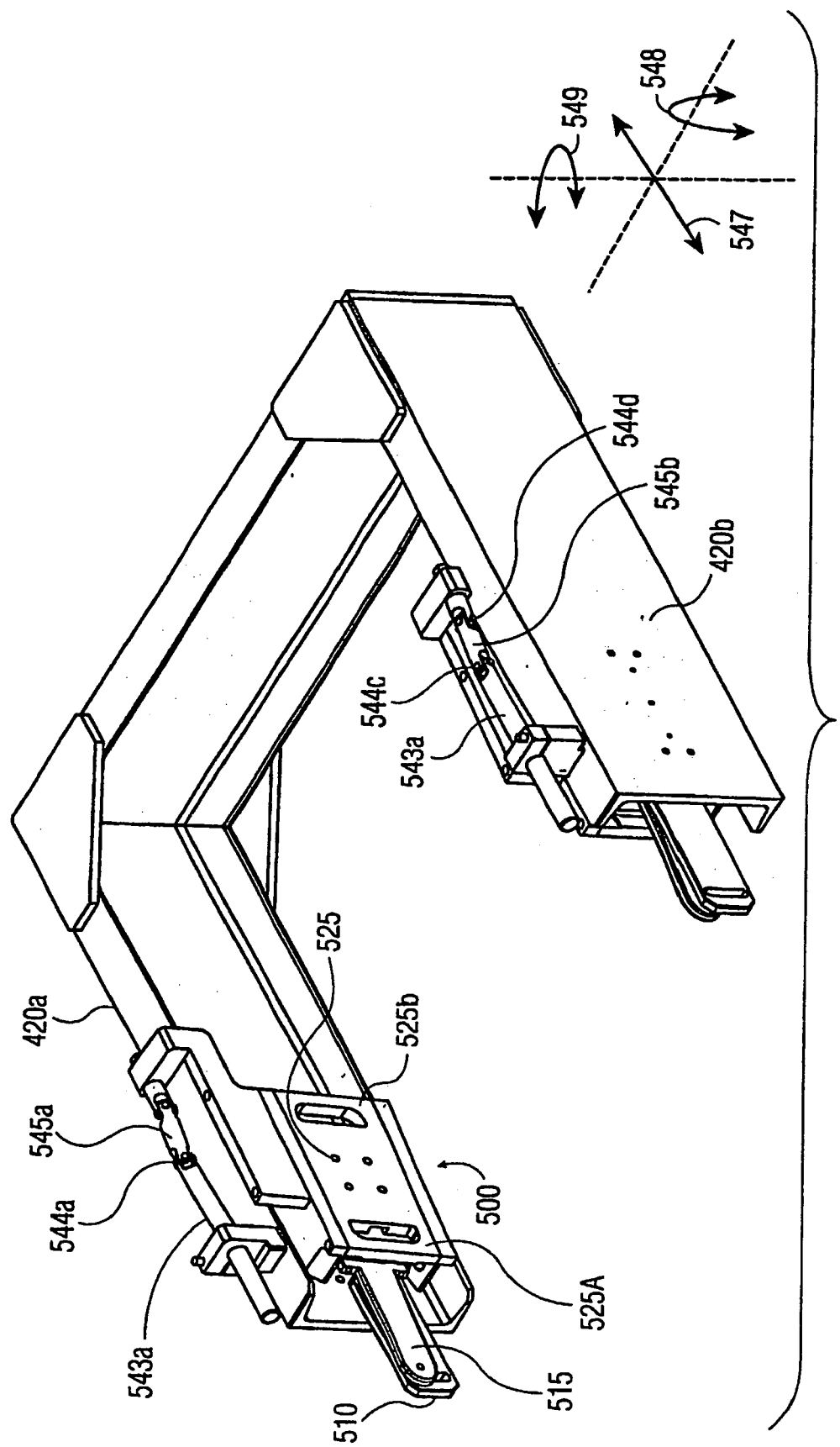
FIG. 4B is another perspective view of the test head cradle assembly in accordance with the present invention, shown in a manipulated position.
Figure 6A:
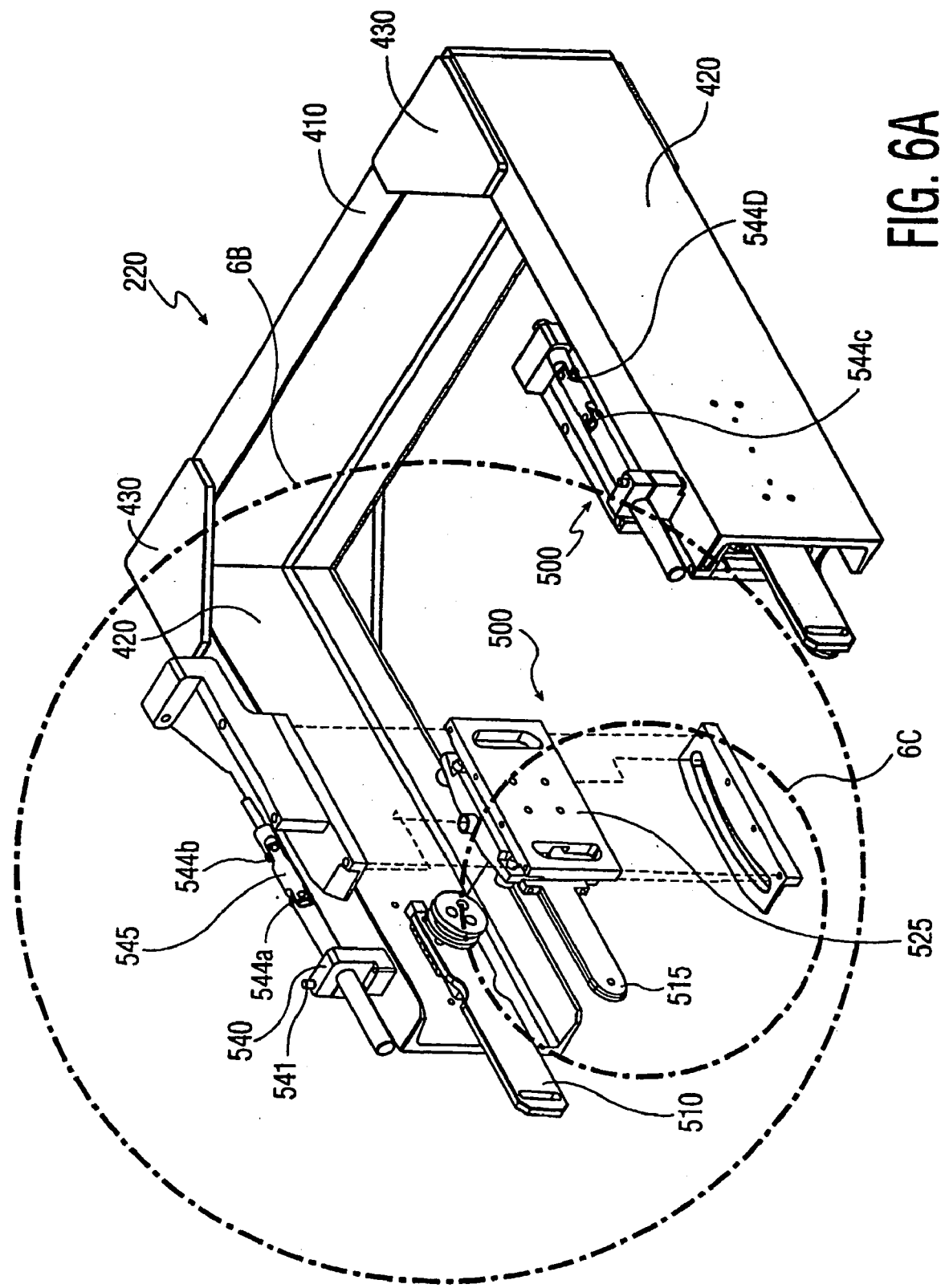
FIG. 6A is an exploded view of the test head cradle assembly and the cradle motion unit of the test head cradle assembly.

Turning now to FIGS. 4A-B and 6A, further details regarding cradle 220 are shown. Cradle 220 includes cradle back 410, and cradle sides 420A and 420B. Corner brackets 430 are included to attach cradle sides 420A and 420B to cradle back 410.

As shown in FIGS. 1B and 4A-B, cradle motion unit 500 is included in cradle 420. Cradle motion unit 500 includes test head attachment block 525 to which the test head is rigidly attached and supported. Cradle motion unit 500 provides n degrees of freedom. In an exemplary embodiment, it provides three degrees of freedom, which are now described: First, translational forward/back motion is provided along a first, translation axis ("in/out axis") 547 that is substantially parallel to cradle sides 420A and 420B. Second, a pivoting motion, known as "tumble" or "pitch" motion about a second axis ("tumble axis") 548 that is orthogonal to attachment block 525. Third, a pivoting motion, known as "theta" motion, about a third axis ("theta axis") 549 that is orthogonal to both the in/out axis 547 and tumble axis 548. These three degrees of freedom permit the test head to be moved inwards and outwards and pivoted about the tumble and theta axes simultaneously or individually as may be required. In an exemplary embodiment either or both of the tumble and theta axes may be arranged so that they pass through the approximate center of gravity of the test head and associated load. This permits rotation about such an arranged axis to be balanced, thus providing a substantially weightless condition with respect to that axis. Vertical motion provided by rail 104 and ball slides 105, horizontal motion provided by-rails 114a,b and ball slides 116a,b, and rotational motion provided by cradle mounting flange 211 provide the additional three degrees of freedom (two translation and one rotation) needed to position the test head. (Backlash within gear box 204 and/or the system of pulleys 218, 210 and belt 216 may be used to provide compliance in the third rotational degree of freedom. In an exemplary embodiment, pulley 210 is attached to a shaft (not shown) with three screws which pass through enlarged clearance holes in pulley 210, which allows pulley 210 to rotationally slip with respect to the shaft (not shown).)

In the following descriptions it is kept in mind that cradle 220 and the attached cradle motion units 500 may be rotated through 180 degrees or more by means of crank 206 and its coupling to cradle mounting flange 211. However, to simplify the discussion, terms such as up and down, upper and lower, bottom and top, etc., are used only to describe the mechanisms in the orientations illustrated in the figures.

An overview of cradle motion unit 500 and it's relationship to cradle side 420A is as follows with reference to FIGS. 6B and 7. Sliding arm 510 is slidingly attached to cradle side 420A by means of rail 670 and ball slide 770, which are arranged substantially parallel to cradle side 420A. Thus, sliding arm 510 provides translational motion along in/out axis 547. Cam follower block 640 is rotationally attached to sliding arm 510 by means of pivot bearing 650. Thus, cam follower block 640 provides rotation movement about tumble axis 548. An attachment unit comprised of attachment block 525 and top and bottom guide blocks 520, 522 is coupled by means of cam followers 610a,f to cam follower block 640. This attachment unit is arranged to provide rotation about theta axis 549. These features and capabilities will now be explained in further detail.

Figure 6B:
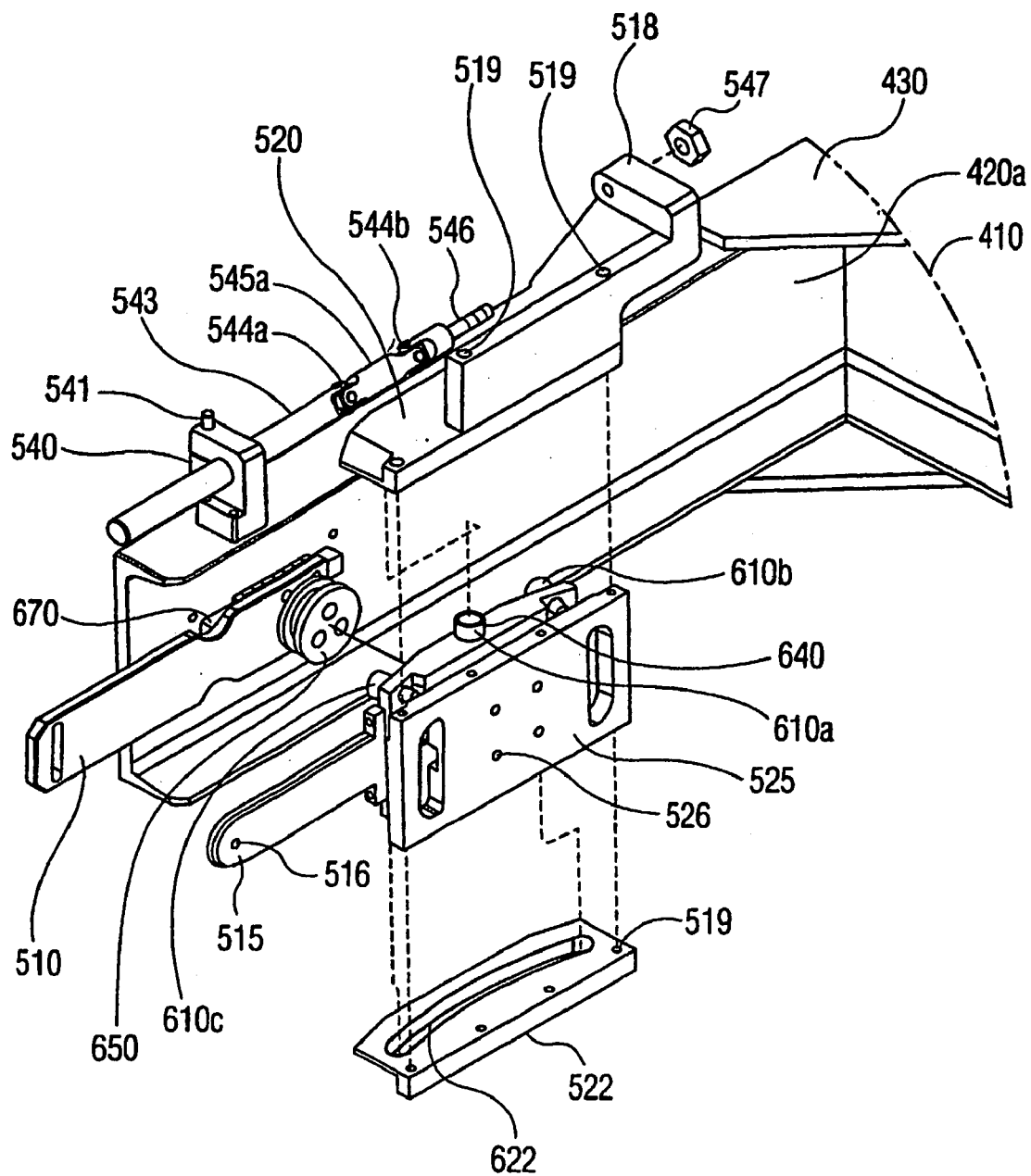
FIG. 6B is an exploded view of the cradle motion unit providing greater detail of the area within circle 6B in FIG. 6A.

The attachment of cradle motion unit 500 to cradle 220 is better shown in FIG. 6B. Specifically, cradle side 420A is shown. Lock block 540 is attached to cradle side 420A. Lock block 540 includes an opening through which locking shaft 543A is inserted. As shown, lock shaft 543A is coupled to connecting shaft 545A by means of universal joint 544A. Connecting shaft 545A is coupled in turn to mounting stud 546A by means of universal joint 544B. Mounting stud 546A is connected to connecting bracket 518A by means of nut 547A. Connecting bracket 518A is attached to top guide block 520 by means of screws 519. Lock screw 541A may be actuated to prevent movement of lock shaft 543A within the opening situated within lock block 540. The underside of top guide block 520 Is attached to the upper side of a plate or test head attachment block 525. Test head attachment block 525 includes holes 526. Screws are inserted through holes 526 in order to attach test head attachment block 525 to the test head.

Test head attachment block 525 is rigidly attached, on an upper surface thereof, to the under surface of top guide block 520. Test head attachment block 525 is rigidly attached, on a lower surface thereof, to the upper surface of bottom guide block 522. Bottom guide block 522 includes circular-arc theta guide slot 622. Furthermore, top guide block 520 includes a similar circular-arc theta guide slot (not shown) which faces and opposes theta guide slot 622. Top guide block 520, test head attachment block 525, and bottom guide block 522 comprise a rigid guide block structure. In an exemplary embodiment, the entire guide block structure is between the side of the cradle and the load. In an alternative embodiment, the size of the load may be smaller than the size of the guide block structure, so that only a portion of the guide block structure may be between the side of the cradle and the load. In such an alternative, at least a portion of the guide block structure may be between the cradle and the load. The guide block structure may be considered to be between the side of the cradle and the load as long as it is located in a plane that is situated between the cradle and the load and that intersects the space between the cradle and the load.

Cam follower block 640 is included. It is adjacent to test head attachment block 525 and is trapped between top guide block 520 and bottom guide block 522 so that they may, as will be explained, rotate together about the tumble axis 548 and translate together along the in/out aixs 547 The rigid guide block structure comprised of attachment block 525 and guide blocks 520, 522 is movable with respect to cam follower block 640. In particular, and as will be further explained, the rigid guide block structure may rotate about theta axis 549 while cam follower block 640 may not rotate about theta axis 549. Cam follower block 640 is also between the side of the cradle and the load. Cam follower block 640 may be considered to be between the side of the cradle and the load as long as it is located in a plane that is situated between the cradle and the load and that intersects the space between the cradle and the load. Cam follower block 640 includes a plurality of cam followers 610a-f attached to it. An additional cam follower, described below, is not shown. Cam follower 610a extends from the top of cam follower block 640. Cam follower 610e and another cam follower (not shown) extend from the bottom of cam follower block 640. Cam follower 610e and the cam follower not shown thus slide within theta guide slot 622. Similarly, cam follower 610a slides within the theta guide slot formed within top guide block 520. In addition, additional cam followers 610b-e (shown in FIGS. 6c and 7) extend from the side of cam follower block 640 facing toward cradle side 420A. Cam followers 610b and 610c travel along, and ride on, the underneath surface of top guide block 520. Cam followers 610d and 610f travel along, and ride on, the top surface of bottom guide block 522.

Cam follower block 640 includes arm 515. When the test head load is rotated about tumble axis 548, the motion of the test head is transmitted to arm 515 through test head attachment block 525 as follows. As explained above, the test head is rigidly attached to test head attachment block 525. Test head attachment block 525 is attached to top guide block 520 and to bottom guide block 522. Therefore, when the test head is rotated about the tumble axis 548, test head attachment block 525 rotates about the tumble axis 548. Because top and bottom guide blocks 520 and 522 are attached to test head attachment block 525, they rotate along with the tumble rotation of test head attachment block 525.

Also as explained above, cam followers 610b and 610c protrude horizontally from the top of the front face of cam follower block 640 and press against the underneath surface of top guide block 520. Similarly, cam followers 610d and 610f protrude from the bottom of the front face of cam follower block 640 and press against the upper surface of bottom guide block 522. Consequently, when test head attachment block 525 rotates clockwise about tumble axis 548, the clockwise rotation of attachment block 525 causes top and bottom guide blocks 520, 522 to rotate clockwise and the following occurs. The underneath surface of top guide block 520 presses downward on cam follower 610b and the upper surface of bottom guide block 522 presses upward on cam follower 610f. Since cam followers 610b and 610f are attached to cam follower block 640, cam follower block 640 rotates clockwise about tumble axis 548 as cam follower 610b moves downward and cam follower 610f moves upward.

Conversely, when test head attachment block 525 rotates counter-clockwise about tumble axis 548, it causes top and bottom guide blocks 520, 522 to rotate counter-clockwise, and the following occurs. The underneath surface of top guide block 520 presses downward on cam follower 610c and the upper surface of bottom guide block 522 presses upward on cam follower 610d. Since cam followers 610c and 610d are attached to cam follower block 640, cam follower block 640 rotates counter-clockwise about tumble axis 548 as cam follower 610c moves downward and cam follower 610d moves upward.

Accordingly, the test head is allowed to rotate in either direction about the tumble axis as long as the cam follower block 640 is allowed to rotate.

When the test head rotates about theta axis 549, movement of test head attachment block 525, top guide block 520, and bottom guide block 522 (the guide block structure) is guided by the insertion of cam follower 610a into the theta guide slot in the undersurface of top guide block 520 and the insertion of cam follower 610e and the not-shown cam follower into theta guide slot 622 in bottom guide block 522. When the guide block structure rotates about theta axis 549, cam follower block 640 and arm 515 do not rotate about theta axis 549. Instead, both cam follower block 640 and arm 515 remain substantially parallel to cradle side arm 420B. Similarly, as explained below, sliding arm 510, which provides translation motion, does not move in a theta direction because it is slidingly attached to cradle side 420A in a manner which keeps it substantially parallel to cradle side 420A.

It will be understood that all explanations describing attachments to cradle side 420A apply to the operation of attachments to cradle side 420B and that explanations describing-attachments to cradle side 420B also apply to attachments to cradle side 420A.

In summary, sliding arm 510 can move only in an in/out translation motion relative to a cradle side arm. It cannot move in a tumble rotation direction or in a theta rotation direction. Cam follower block 640 and arm 515 can move together in an in/out translation direction or in a tumble rotation direction relative to a cradle side 420A or B. They cannot move in a theta rotation direction. Test head attachment block 525 and top and bottom guide blocks 520 and 522 can move in an in/out translation motion, a tumble rotation direction, and a theta rotation direction.

Figure 5:
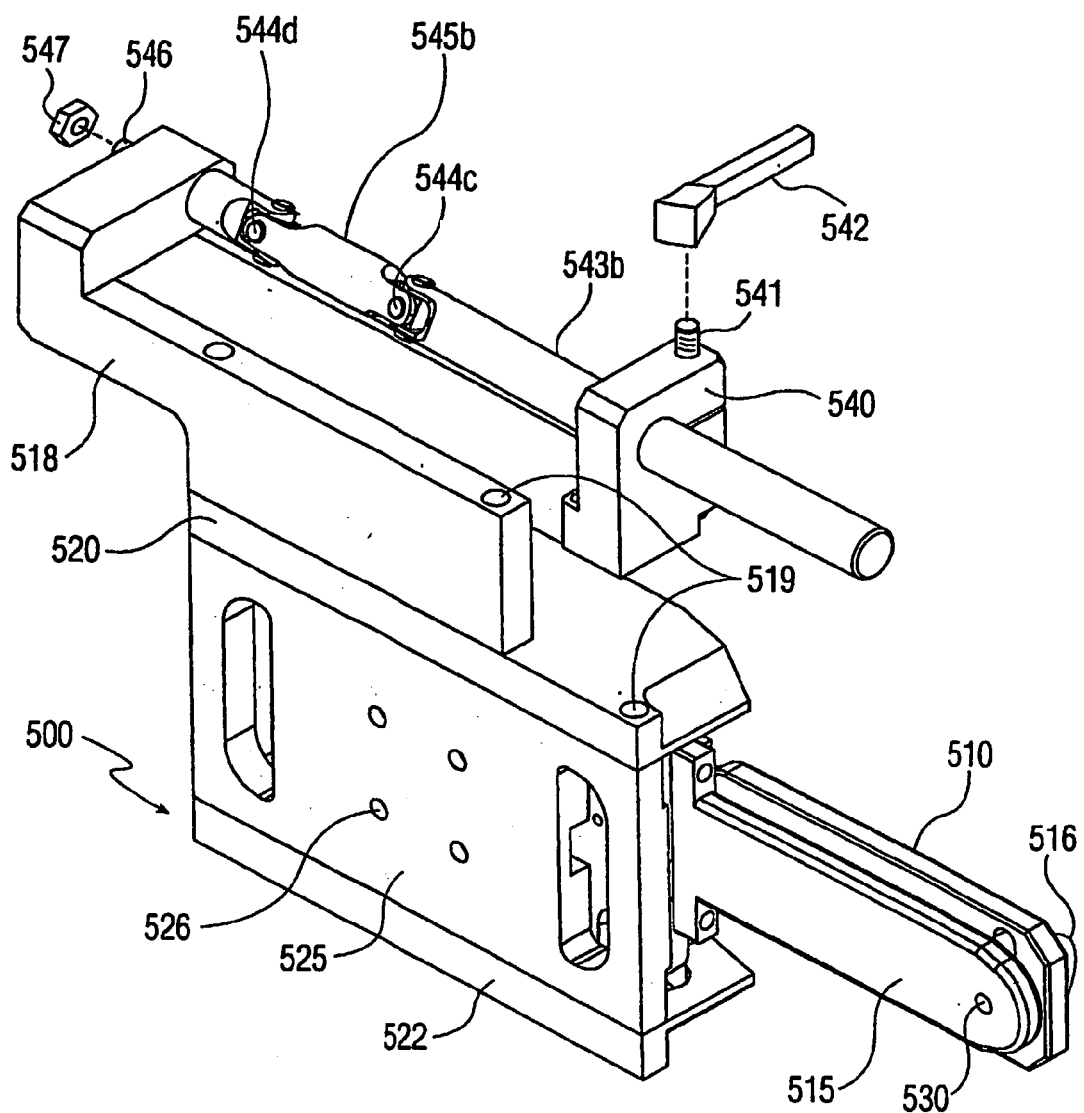
FIG. 5 is a perspective view of a cradle motion unit of the test head cradle assembly.
Figure 6C:
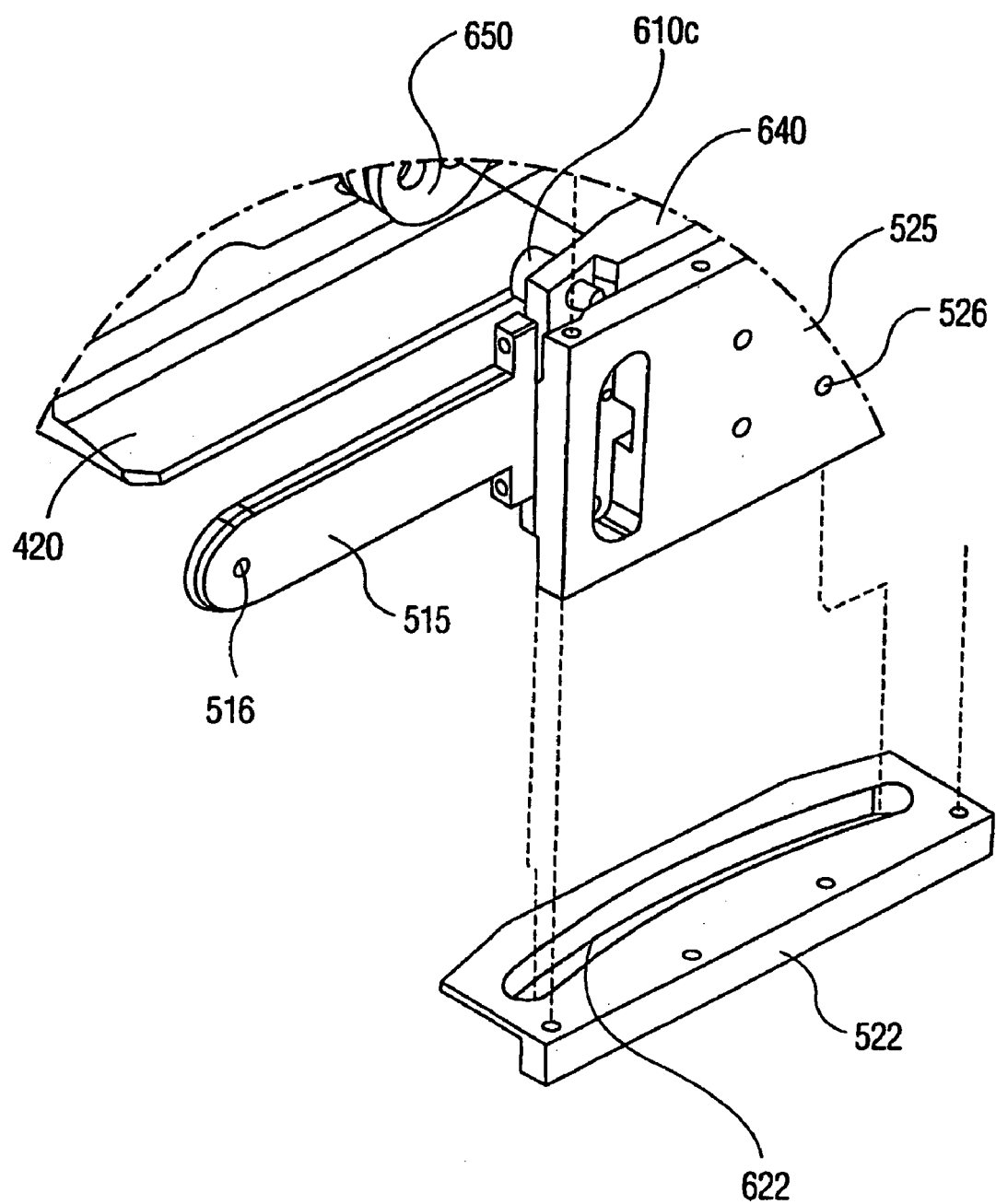
FIG. 6C is an exploded view the cradle motion unit providing greater detail of the area within circle 6C in FIG. 6A.

The test head can be rotated counter-clockwise approximately 5 degrees about the tumble axis 548. The motion of the test head can be transmitted to test head attachment block 525 and to arm 515, both of which are shown as being rotated counter-clockwise relative to cradle side 420A. On the other hand, FIG. 4B shows a test head that has been rotated clockwise approximately 5 degrees about tumble axis 548. The motion of the test head in FIG. 4B has been transmitted to test head attachment block 525 and to arm 515, both of which are shown as being rotated upward relative to cradle side 420A. As best shown in FIGS. 5, 6C and 7, arm 515 includes an opening 516 to accommodate lock 530.

Figure 7:
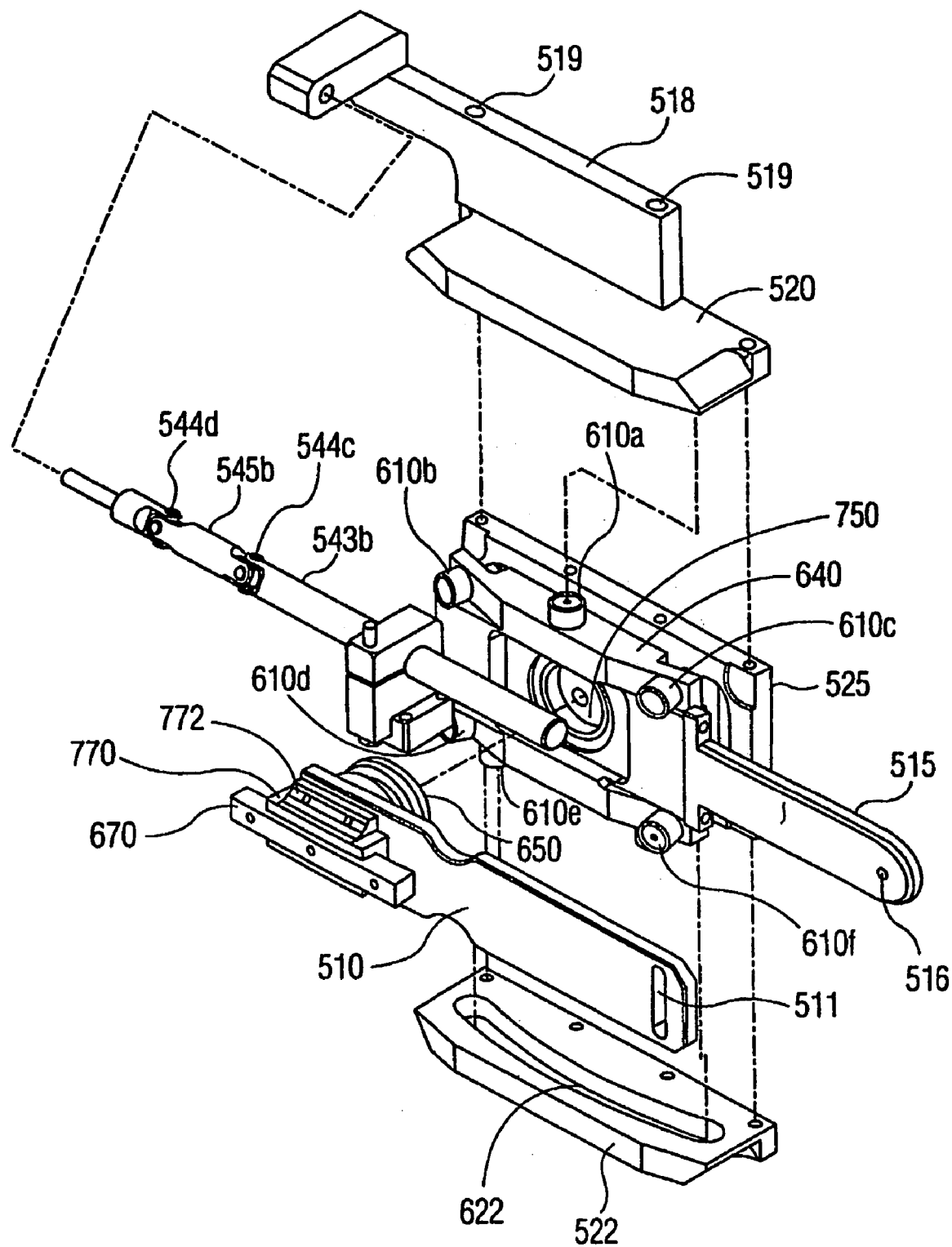
FIG. 7 is an exploded view of another side of the cradle motion unit.

As best shown in FIG. 7, cam follower block 640 has a circular opening 750 that serves as a tumble pivot bearing receptacle. As best shown in FIGS. 6B and 7, sliding arm 510 is included. Sliding arm 510 is coupled to cam follower block 640 and arm 515 via the insertion of tumble pivot bearing assembly 650 into tumble pivot bearing receptacle 750. Thus, arm 515 and arm support block 640 are able to rotate relative to sliding arm 510. When lock 530 (see also FIG. 5) is actuated in hole 516 and slot 511, it prevents relative tumble axis 548 rotation between sliding arm 510 and arm 515.

In combination, the two locks formed by lock block 540 and lock 530 comprise two locks which can prevent three degrees of freedom. In other words, cradle 220 is a support structure that allows n degrees of freedom and locks 541 and 530 are n−1 locks that prevent the n degrees of freedom when they are actuated.

FIG. 7 shows the cradle motion unit that is attached to cradle side 420B. As better shown by FIG. 7, sliding arm 510 has a ball slide mounting bracket 772 attached thereto in order to accommodate ball slide 770. Ball slide 770, and therefore, sliding arm 510, are able to slide relative to linear guide rail 670. Linear guide rail 670, in turn, is rigidly attached to cradle side 420B. Linear guide rail 670, ball slide 770, ball slide mounting bracket 772, and sliding arm 510 comprise a sliding arm structure.

The ways in which the elements of cradle motion unit 500 can move and cannot move will now be further explained. Sliding arm 510 can provide translation motion along an in/out axis 547 that is substantially parallel to cradle sides 420A and 420B. This translation motion is enabled because sliding arm 510 is coupled to ball slide 770 and ball slide 770 slides along guide rail 670. Because sliding arm 510 is so coupled to the cradle side arms 420A and 420B via guide rail 670, sliding arm 510 is not able to rotate about either tumble axis 548 or theta axis 549. Therefore, in the absence of translation motion, sliding arm 510 remains stationary when other parts of cradle motion unit 500 move about any rotation axis.

Arm 515 is coupled to sliding arm 510 via tumble pivot bearing assembly 650 and tumble pivot bearing receptacle 750. Therefore, when arm 510 moves in an in/out translation direction, arm 515 moves along with it. That is, arms 510 and 515 move as a matched set in translation motion.

Arm 515, cam follower block 640, and test head attachment block 525 may rotate about tumble axis 548 due to the action of cam followers 610b-d, f with top and bottom guide blocks 520 and 522 as explained above. The presence of tumble pivot bearing assembly 650 and tumble pivot bearing receptacle 750 allows cam follower block 640 and arm 515 to rotate about tumble axis 548 relative to cradle side 420B and relative to sliding arm 510. Sliding arm 510 does not rotate about tumble axis 548 when arm 515 and cam follower block 640 rotate in a tumble direction, as previously described. Although sliding arm 510 is coupled to arm 515 and cam follower block 640 via tumble pivot bearing assembly 650 and tumble pivot bearing receptacle 750, sliding arm 510 is prevented from rotating in a tumble direction because it is attached to the cradle side 420A with only a translational degree of freedom. As explained above, the coupling between sliding arm 510 and arm 515 allows matched motion only along a translation axis. The coupling does not allow sliding arm 510 to rotate.

The guide block structure (test head attachment block 525, top and bottom guide blocks 520, 522) may rotate in a theta direction due to cam followers 610a, 610e, and another cam follower that is not shown operating in circular arc shaped guide slots 622 included in guide blocks 520,522. Theta movement of the guide block structure does not cause theta movement of arm 515, cam follower block 640, or sliding arm 510. Sliding arm structure cannot rotate because it is attached to the cradle side 420A with only a translational degree of freedom. The cam follower block 640 and arm 515 cannot rotate about theta axis 549 because they are coupled to the sliding arm structure via tumble pivot bearing assembly 650 and tumble pivot bearing receptacle 750.

It will be understood that each of the cradle sides 420A and 420B has mounted on it a complete cradle motion unit 500 as described above. The operation of cradle motion unit 500 will now be explained. The operation of each cradle motion unit 500 will be the same regardless of whether it is attached to one cradle side 420A,B or the other. When both cradle motion units 500 are operated in unison, however, some of their motions will be congruent to each other while some motions may be mirror images of each other. These features of cradle motion units 500 will be explained in more detail below.

When a test head is attached to the test head attachment block 525, the test head may be required to move in one, two, or three degrees of freedom within the cradle, as described previously. FIGS. 4A-C show motion cradle units 500 attached to cradle side arms 420A and 420B. The motion cradle units in FIG. 4A are in a central, or no movement, position. That is, neither the cradle motion unit, nor the attached test head, has been subjected to any translation motion or to any rotation motion.

Referring to FIG. 4B, it may be seen that the motion cradle unit 500 and, therefore, the test head, have not been subjected to any translation motion; but that they have been subjected to theta rotation and to pitch or tumble rotation. Theta rotation is guided by circular-arc theta guide slot 622 that is shown in FIGS. 6A, 6B, and 6C and by the circular arc shaped theta guide slot in the underside of top guide block 520. The theta rotation may be clockwise or counter-clockwise as shown by arrow 549 in FIG. 4B. The centers of the circular arc guide slots are aligned with the theta axis described above. The circular arc shaped guide slots are located on concentric circles that lie in planes orthogonal to the theta axis. In a first exemplary embodiment the guide slots and cam followers are arranged so that the theta axis, defined by the centers of the circles containing the guide slots, passes through the approximate center of gravity of the test head load. This embodiment may be advantageous in terms of providing a substantially weightless condition of the test head with respect to theta motion. In an alternative embodiment, the guide and the cam followers are arranged so that the theta axis and the centers of the circles containing the guide are not at the center of gravity of the test head load. This may have an advantage when the test site of the test head is not located near the test head's center of gravity and is desired to provide theta motion about the center of the test site. If desired a substantially weightless condition may be achieved by adding or deleting appropriate weights to the test head.

Pitch or tumble rotation is guided by the elements described above. Pitch rotation may be clockwise or counter clockwise as shown by arrow 548 in FIGS. 4A, B and C.

Figure 8B:
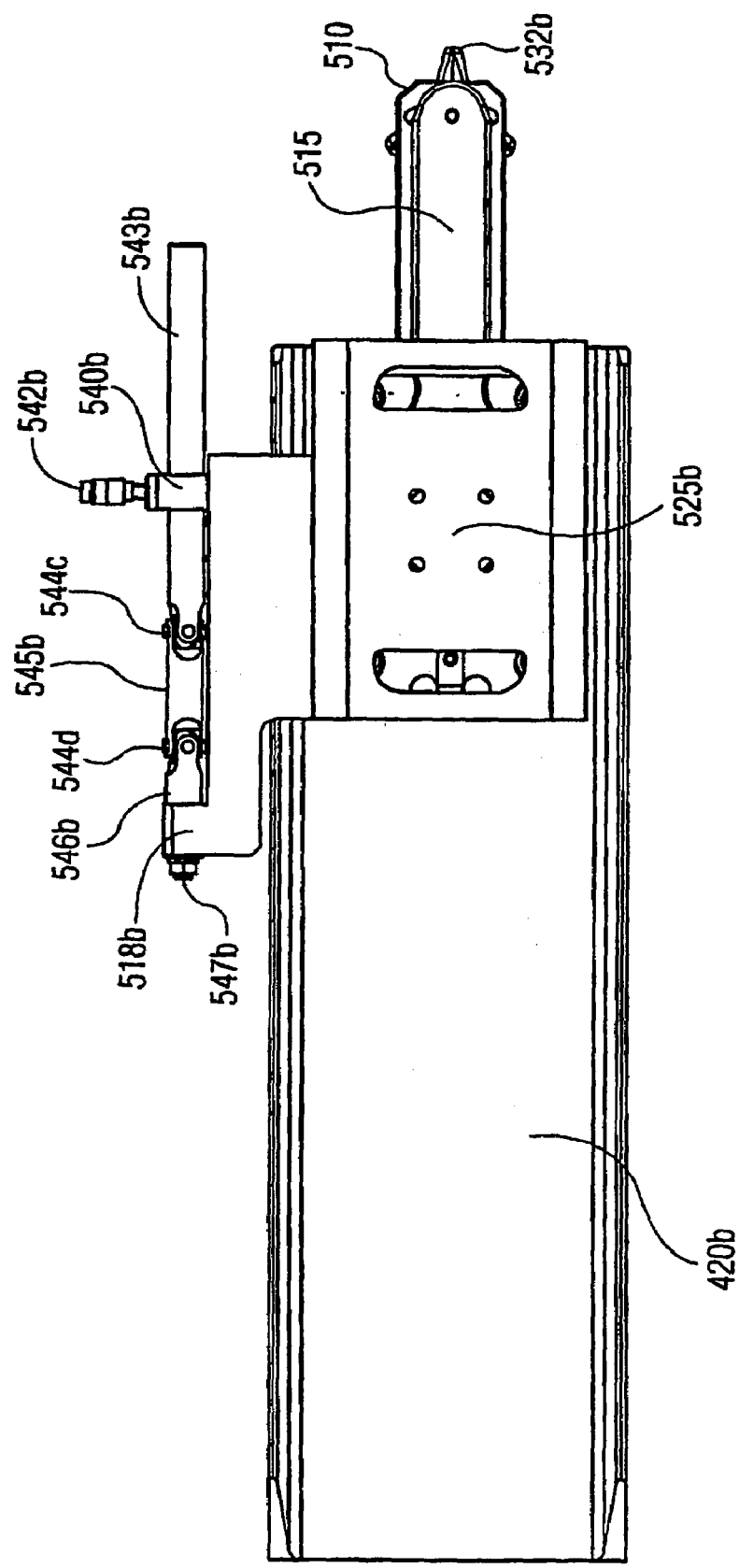
FIG. 8B is an inside elevation view of a cradle side, attached cradle motion unit, and associated components.
Figure 9:
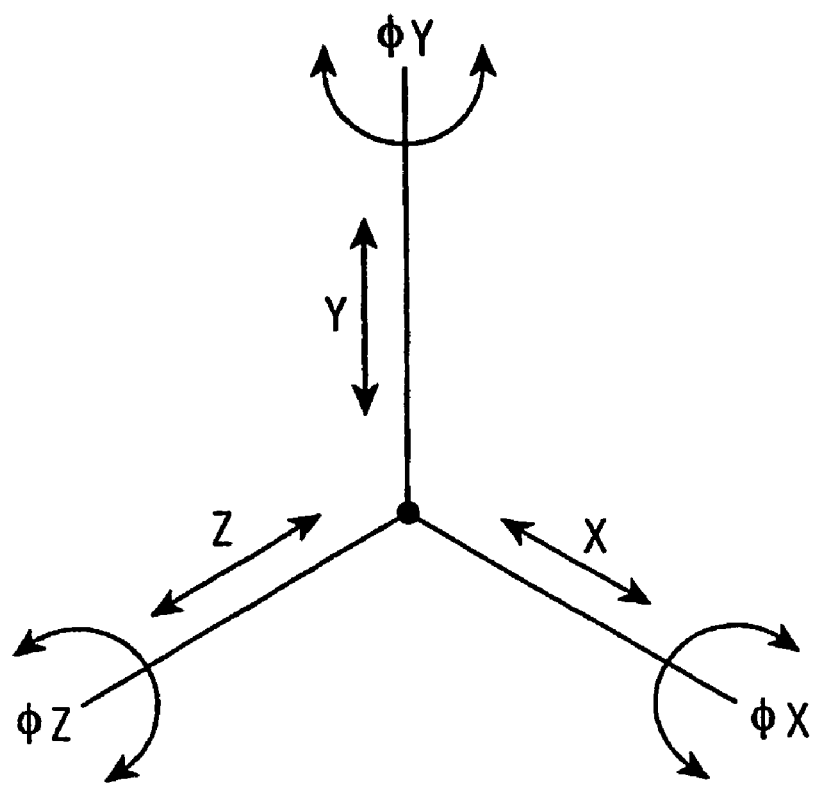
FIG. 9 diagramatically shows the six degrees of freedom of the system shown in the figures.

Attention is now turned to a further description of theta and tumble rotations and the associated changes in the configuration of lock shaft 543A,B, connecting shaft, 545A, B, mounting stud 546A,B, and universal joints 544*a*-D. As previously mentioned, FIG. 4A shows cradle motion units 500 at their nominal positions with zero in/out translation, zero tumble rotation, and zero theta rotation. This may be referred to as the "zero, zero, zero position." To overcome any optical illusion from the perspective of FIG. 4A, FIGS. 8A and B show a top view and an inside elevation, respectively of cradle side 420B and the attached cradle motion unit 500B and associated components. It is important to observe that in this zero, zero, zero position that lock shaft 543B, connecting shaft 545B, and mounting stud 546B are arranged in an approximate straight line that is approximately centered over the upper surface of cradle side 420B and which is approximately parallel to both the upper and side surfaces of cradle side 420B. The similar components attached to cradle side 420A are arranged in a similar fashion in the zero, zero, zero position.

Referring to FIGS. 4A-C and 8A, 8B, as attachment blocks 525A and B are moved in three degrees of freedom with respect to cradle sides 420A and B universal joints 544B and D move respectively with them. However, universal joints 544A and C remain approximately centered and at a constant height above the upper surface of their respective cradle side 420A, B. Universal joints 544A and C may only translate parallel to cradle sides 420A and B as lock shafts 543A and B slide in their respective lock blocks 540A and B. For each unique position of an attachment plate 525A or B with respect to its respective cradle side 420A or B, there are unique positions in space for the two ends of the respective connecting rod 545A or B relative to the respective cradle side 420A or B.

To assist the description of theta rotation, the two ends of test head attachment block 525A have been designated as 525AA and 525AB. FIG. 4B shows that test head attachment block 525A has been rotated about the theta axis approximately five degrees in a clockwise direction, but no translation motion has taken place. Such rotation can be observed by observing that end 525AB has been rotated clockwise so that it is somewhat away from cradle side 420A and end 525AA has been rotated clockwise so that it is somewhat closer to cradle side 420A. This rotation of test head attachment block 525A can be more easily observed by comparing FIG. 4B with FIG. 4A. This clockwise rotation is further enabled by the bending of universal joints 544A and B. FIG. 4B shows that universal joint 544B has moved inwards towards the center of cradle 220; and, consequently, connecting shaft 545A is pointing from universal joint 544A inwardly towards the center of cradle 220. In comparison universal joint 544D, which is coupled to the cradle motion unit 500B attached to cradle side 420B has moved towards the outside of cradle side 420B. Consequently, connecting shaft 545B points from universal joint 544C outwardly away from the center of cradle 220. To accommodate the required positions of connecting shafts 545A and B, lock shafts 543A and B slide as necessary in lock blocks 540A and B; and universal joints 544A-C bend as necessary. Also, both sliding arms 510 and arms 515 remain substantially parallel to cradle sides 420A an B.

FIG. 4B also shows tumble rotation of approximately five degrees clockwise. This clockwise rotation may be observed by noting the relative positions of arm 515 and sliding arm 510 in FIG. 4B. That is, arm 515 has been rotated clockwise relative to sliding arm 510. However, both sliding arm 510 and arm 515 remain substantially parallel to cradle side 420A. Again, this rotation can be more easily observed by comparing FIG. 4B with FIG. 4A. This upward rotation is further enabled by the bending of universal joints 544A and B. FIG. 4B shows that universal joint 544B has moved downwards towards the upper surface of cradle side 420A. Similarly, universal joint 544D has also moved downwards towards the upper surface of cradle side 420B. Consequently, connecting shafts 545A and 545B each point downwards from universal joints 544 A and C toward their respective cradle sides 420A and 420B. To accommodate the required positions of connecting shafts 545A and B, lock shafts 543A and B slide as necessary in lock blocks 540A and B; and universal joints 544A-C bend as necessary.

In FIG. 4C test head attachment block 525A has been rotated about the theta axis approximately five degrees in a counter clockwise direction. Such rotation can be observed by observing that end 525AA has been rotated counter clockwise so that it is somewhat away from cradle side 420A and end 525AB has been rotated clockwise so that it is somewhat closer to cradle side 420A. This rotation of test head attachment block 525A can be more easily observed by comparing FIG. 4C with FIG. 4A. This clockwise rotation is further enabled by the bending of universal joints 544A and B. FIG. 4C shows that universal joint 544B has moved towards the outside of cradle side 420B; and, consequently, connecting shaft 545A is pointing from universal joint 544A outwardly away from the center of cradle 220. In comparison universal joint 544D, which is coupled to the cradle motion unit 500B attached to cradle side 420B has moved inwards towards the center of cradle 220. Consequently, connecting shaft 545B points from universal joint 544C inwardly towards the center of cradle 220. To accommodate the required positions of connecting shafts 545A and B, lock shafts 543A and B slide as necessary in lock blocks 540A and B; and universal joints 544A-C bend as necessary. Also, both sliding arms 510 and arms 515 remain substantially parallel to cradle sides 420A an B.

FIG. 4C also shows tumble rotation of approximately five degrees counter clockwise. This counter clockwise rotation may be observed by noting the relative positions of arm 515 and sliding arm 510 in FIG. 4C. That is, arm 515 has been rotated clockwise relative to sliding arm 510. However, both sliding arm 510 and arm 515 remain substantially parallel to cradle side 420A. Again, this rotation can be more easily observed by comparing FIG. 4C with FIG. 4A. This counter clockwise rotation is further enabled by the bending of universal joints 544A and B. FIG. 4C shows that universal joint 544B has moved upwards away from the upper surface of cradle side 420A. Similarly, universal joint 544D has also moved upwards away from the upper surface of cradle side 420B. Consequently, connecting shafts 545A and 545B each point upwards from universal joints 544 A and C away from their respective cradle sides 420A and 420B. To accommodate the required positions of connecting shafts 545A and B, lock shafts 543A and B slide as necessary in lock blocks 540A and B; and universal joints 544A-C bend as necessary.

Two sets of two locks each are provided in order to prevent motion in three degrees of freedom. One set comprises in/out lock block 540A and tumble lock 530A on cradle side 420A. The second set comprises in/out lock block 540B and tumble lock 530B on cradle side 420B. In order to prevent motion in three degrees of freedom it is only necessary to activate one of in/out lock blocks 540A,B together with one of tumble locks 530A,B. Two sets are provided for redundancy and operator convenience. The invention may be practiced in alternative embodiments with only one of each lock.

Referring to FIG. 6A, sliding arm 510 includes a slot 511, which traverses nearly the entire width of sliding arm 510. The width of slot 511 coincides with the various positions which opening 516 in arm 515 may traverse. Alternatively, slot 511 may be arced and of constant width. As shown in FIG. 5, for example, a tumble lock 530 may be inserted through the opening 516 in arm 515 and the slot 511 within sliding arm 510. Actuating lock 530 prevents tumble motion of arm 515 relative to sliding arm 510.

Furthermore, lock shafts 543A and B must slide within lock blocks 540A and B respectively in order to accommodate each new position, whether the motion is translation along in/out axis 547 or rotation about either theta axis 549 or tumble axis 548. In order to prevent motion in either degree of freedom, tumble locks 530A or 530B must be actuated in addition to locks 540A or 540B, or both. Otherwise, even if one of in/out locks 540A,B are actuated, tumble motion will still result in in/out motion as connecting shaft 545 adjusts to its new position.

Thus, actuating a lock 540 A,B prevents motion in two degrees of freedom, provided that a tumble lock 530A,B has also been actuated, preventing in/out translation motion and theta rotation motion, as previously defined. Theta rotation is prevented because, when a lock block 540A,B is actuated, the corresponding shaft 543A,B cannot slide through lock block 540A,B and, consequently, universal joints 544A-D are prevented from further bending, thereby further preventing clockwise and counterclockwise theta rotation of the cradle motion units. This similarly prevents further in/out motion. Thus, lock 540A,B locks two degrees of freedom, one translational and one rotational, in particular in/out motion 547 and rotation about theta axis 549 simultaneously with lock 530A,B locking rotation about tumble axis 548. Thus, two locks effectively lock rotational motion about two orthogonal axes and translation motion along a third axis which is orthogonal to both rotation axes.

Although the invention is illustrated and described herein with reference to specific embodiments, the invention is not intended to be limited to the details shown. Rather, various modifications may be made in the details within the scope and range of equivalents of the claims and without departing from the invention. More specifically, the invention has been described as shown in the various figures. However, the invention can be implemented in other embodiments that fall within the invention as explained, described, and claimed. While the parts of the invention have been shown in one arrangement, some of the parts may be arranged differently.

For example, cradle motion unit 500 may be located closer to cradle back 410 than is shown in the figures. Cradle motion unit 500 may be located on the outside of cradle sides 420A, 420B to accommodate a load having a different shape. Slot 511 in sliding arm 510 may have a different shape and/or may be smaller. Opening 516 In arm 515 may be a different shape and/or may be larger. Cam follower 610a may be placed in a location that is not at the center of arm support block 640. Tumble pivot bearing assembly 650 may have a different shape and/or may be placed on the outside of test head attachment block 525 rather than between sliding arm 510 and arm 515. Instead of attaching the test head load directly to test head attachment block 525, another part may be placed between the test head and block 525. Only one cradle motion unit 500 may be used instead of two. The cradle may have more than two cradle side arms and a cradle motion unit may be attached to each cradle side arm. Cradle motion units may be attached to the inside or the outside of various cradle arms depending on need.

What is claimed:

1. An apparatus for positioning a test head, comprising:
   a support structure which provides three degrees freedom to the test head;
   a sliding member of the support structure for guiding motion of the test head along three degrees of freedom;
   a first lock for preventing motion of the test head in one degree of freedom; and
   a second lock for preventing motion of the sliding member and preventing motion of the test head in two of the three degrees of freedom.

2. The apparatus of claim 1, wherein the three degrees of freedom include a translation motion along a first axis, a first rotation motion about a second axis, and a second rotation motion about a third axis.

3. The apparatus of claim 2, wherein actuation of the first and second locks prevents the first and second rotation motions and the translation motion.

4. The apparatus of claim 2, wherein the support structure includes a first cradle side and a plate coupled to the first cradle side for providing the translation motion and the first axis that is substantially parallel to the first cradle side.

5. The apparatus of claim 4, wherein the second axis is orthogonal to the first axis.

6. The apparatus of claim 5, wherein the third axis is orthogonal to the first axis and the second axis.

7. The apparatus of claim 6, further comprising:
   at least one guide block coupled to the test head, the at least one guide block having a circular arc shaped slot, wherein
   a center of the circular arc shaped slot is aligned with the third axis, and
   the circular arc shaped slot is located on a circle that is orthogonal to the third axis.

8. The apparatus of claim 4, further comprising:
   at least one guide block coupled to the test head, the at least guide block having a circular arc shaped slot; and
   at least one cam follower attached to the plate for insertion into the circular arc shaped slot.

9. The apparatus of claim 7, further comprising:
   at least one cam follower attached to the plate for insertion into the circular arc shaped slot,
   wherein the circular arc shaped slot and the at least one cam follower are arranged so that rotation about the center is not at a center of gravity of the load.

10. A system for guiding a test head along three degrees of freedom where the first degree of freedom is rotation about a first axis, the second degree of freedom is rotation about a second axis which is orthogonal to the first axis, and the third degree of freedom is translation along a third axis that is orthogonal to both the first axis and the second axis, wherein the system comprises:
    a sliding member for guiding the test head along three degrees of freedom,
    a first lock for preventing motion of the test head in one degree of freedom, and
    a second lock for preventing motion of the sliding member and for preventing motion of the test head in two of the three degrees of freedom.

11. An apparatus attached to a side of a cradle for positioning a load relative to the cradle, the apparatus comprising:
- a sliding arm structure between the side of the cradle and the load for translation motion along a first axis;
- an arm support block, also between the side of the cradle and the load, for rotating the load about a second axis orthogonal to the first axis;
- a guide block structure, at least a portion thereof being between the side of the cradle and the load, for rotating the load about a third axis orthogonal to the first axis and the second axis.

12. The apparatus of claim 11, wherein the guide block structure includes at least one circular arc shaped slot that defines the second rotation motion, the third axis being located at a center of the at least one circular arc shaped slot.

13. The apparatus of claim 11, wherein
- the sliding arm structure is attached to the side of the cradle,
- the arm support block is adjacent to the sliding arm structure and between the sliding arm structure and the guide block structure, and
- the guide block structure is coupled to the cradle.

14. The apparatus of claim 11, further comprising
- a first lock coupled to the sliding arm structure; and
- a second lock coupled to the cradle,
- wherein actuation of the first and second locks prevents the translation motion, the first rotation motion, and the second rotation motion.

15. A method for positioning a test head in a cradle motion unit, the method comprising the steps of:
- positioning the test head on a first degree of freedom relative to a cradle of the cradle motion unit;
- positioning the test head on a second degree of freedom relative to the cradle;
- positioning the test head on a third degree of freedom relative to the cradle;
- actuating a first lock coupled to the cradle; and
- actuating a second lock coupled to the cradle,
- wherein actuation of the first and second locks prevents motion of the test head relative to the cradle in the three degrees of motion.

16. A method of positioning a test head relative to a cradle while said cradle is kept stationary, the method comprising the steps of:
- imparting linear motion relative to the cradle;
- imparting tumble motion relative to the cradle;
- imparting theta motion relative to the cradle;
- actuating a first lock coupled to the cradle; and
- actuating a second lock coupled to the cradle,
- wherein actuation of the first and second locks prevents motion in the three degrees of motion.

* * * * *